United States Patent
Zhang et al.

(10) Patent No.: US 10,613,976 B2
(45) Date of Patent: Apr. 7, 2020

(54) METHOD AND STORAGE DEVICE FOR REDUCING DATA DUPLICATION

(71) Applicant: HUAWEI TECHNOLOGIES CO., LTD., Shenzhen (CN)

(72) Inventors: Zongquan Zhang, Chengdu (CN); Chengwei Zhang, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 9 days.

(21) Appl. No.: 15/959,273

(22) Filed: Apr. 22, 2018

(65) Prior Publication Data

US 2018/0267896 A1    Sep. 20, 2018

Related U.S. Application Data

(63) Continuation of application No. PCT/CN2015/099572, filed on Dec. 29, 2015.

(51) Int. Cl.
  *G06F 12/02* (2006.01)
  *G06F 17/30* (2006.01)
  (Continued)

(52) U.S. Cl.
  CPC .......... *G06F 12/0253* (2013.01); *G06F 3/061* (2013.01); *G06F 3/067* (2013.01);
  (Continued)

(58) Field of Classification Search
  CPC ...... G06F 3/061; G06F 16/00; G06F 16/1748; G06F 3/0608; G06F 3/0641; G06F 3/067; H03M 7/3091
  (Continued)

(56) References Cited

U.S. PATENT DOCUMENTS

2006/0282457 A1    12/2006  Williams et al.
2010/0281207 A1    11/2010  Miller et al.
(Continued)

FOREIGN PATENT DOCUMENTS

| CN | 103514250  A | 1/2014 |
| CN | 104239518  A | 12/2014 |
| JP | 2008537209  A | 9/2008 |
| JP | 2014508362  A | 4/2014 |
| KR | 20150052402 A | 5/2015 |
| WO | 2012067805  A2 | 5/2012 |

OTHER PUBLICATIONS

Benjamin Zhu et al., "Avoiding the Disk Bottleneck in the Data Domain Deduplication File System",FAST '08: 6th USENIX Conference on File and Storage Technologies,2008,total 14 pages.

*Primary Examiner* — Tuan V Thai
*Assistant Examiner* — Edward Waddy, Jr.
(74) *Attorney, Agent, or Firm* — Kilpatrick Townsend & Stockton LLP

(57) ABSTRACT

The present disclosure directs to solutions for performing deduplication by a storage device. In the solutions, according to a duplicate data locality principle, non-duplicate data blocks whose logical addresses are contiguous are stored in contiguous physical addresses in a sequence of the logical addresses, and fingerprints of the non-duplicate data blocks whose logical addresses are contiguous are also stored in contiguous physical addresses in the sequence of the logical addresses, and in addition, a mapping from a logical address, which is of one data block in the non-duplicate data blocks whose logical addresses are contiguous, to an aggregation address is established.

16 Claims, 10 Drawing Sheets

(51) Int. Cl.
*G06F 3/06* (2006.01)
*H03M 7/30* (2006.01)
*G06F 16/174* (2019.01)
*G06F 16/00* (2019.01)

(52) U.S. Cl.
CPC .......... *G06F 3/0608* (2013.01); *G06F 3/0641* (2013.01); *G06F 16/00* (2019.01); *G06F 16/1748* (2019.01); *H03M 7/3091* (2013.01); *G06F 3/0671* (2013.01); *G06F 2212/1044* (2013.01)

(58) Field of Classification Search
USPC .................. 711/103, 112, 166, 100, E12.001
See application file for complete search history.

(56) References Cited

U.S. PATENT DOCUMENTS

| | | | |
|---|---|---|---|
| 2011/0055471 A1 | 3/2011 | Thatcher et al. | |
| 2011/0258374 A1* | 10/2011 | Pertocelli | G06F 3/0608 711/104 |
| 2012/0233417 A1 | 9/2012 | Kalach et al. | |
| 2013/0332660 A1* | 12/2013 | Talagala | G06F 12/0246 711/103 |
| 2014/0089264 A1* | 3/2014 | Talagala | G06F 3/065 707/649 |
| 2014/0188822 A1 | 7/2014 | Das | |
| 2014/0281361 A1 | 9/2014 | Park et al. | |
| 2015/0363328 A1 | 12/2015 | Candelaria | |
| 2017/0123712 A1 | 5/2017 | Li et al. | |

\* cited by examiner

CONT.
FROM

| LA 1 | LA 2 | LA 3 | LA 4 | LA 5 | LA 6 |
|------|------|------|------|------|------|

| LA 7 | LA 8 | LA 9 | LA 10 | LA 11 | LA 12 |
|------|------|------|-------|-------|-------|

| LA 13 | LA 14 | LA 15 | LA 16 |
|-------|-------|-------|-------|

Container 1

| FP 1 PA 1 | FP 2 PA 2 | FP 3 PA 3 | FP 4 PA 4 | FP 5 PA 5 | FP 6 PA 6 |
|-----------|-----------|-----------|-----------|-----------|-----------|

| FP 7 PA 7 | FP 8 PA 8 | FP 9 PA 9 | FP 10 PA 10 | FP 11 PA 11 | FP 12 PA 12 |

| FP 13 PA 13 | FP 14 PA 14 | FP 15 PA 15 | FP 16 PA 16 |

Container 3

CONT.
FROM
FIG. 2A

| LA 30 | LA 31 | LA 32 | LA 33 | LA 34 | LA 35 |
|---|---|---|---|---|---|
| LA 36 | LA 37 | LA 38 | LA 39 | LA 40 | LA 41 |
| LA 42 | LA 43 | LA 44 | LA 45 | | |

Container 2

| FP 30 PA 101 | FP 31 PA 102 | FP 32 PA 103 | FP 33 PA 104 | FP 34 PA 105 |
|---|---|---|---|---|
| FP 35 PA 106 | FP 36 PA 107 | FP 37 PA 108 | FP 38 PA 109 | FP 39 PA 110 |
| FP 40 PA 111 | FP 41 PA 112 | FP 42 PA 113 | FP 43 PA 114 | FP 44 PA 115 |
| FP 45 PA 116 | | | | |

Container 4

FIG. 2C

CONT.
FROM

| LA 1 | LA 2 | LA 3 | LA 4 | LA 5 | LA 6 |

| LA 7 | LA 8 | LA 9 | LA 10 | LA 11 | LA 12 |

| LA 13 | LA 14 | LA 15 | LA 16 |

Container 1

| FP 1 PA 1 | FP 2 PA 2 | FP 3 PA 3 | FP 4 PA 4 | FP 5 PA 5 | FP 6 PA 6 |

| FP 7 PA 7 | FP 8 PA 8 | FP 9 PA 9 | FP 10 PA 10 | FP 11 PA 11 | FP 12 PA 12 |

| FP 13 PA 13 | FP 14 PA 14 | FP 15 PA 15 | FP 16 PA 16 |

Container 3

METHOD AND STORAGE DEVICE FOR REDUCING DATA DUPLICATION

CROSS-REFERENCE TO RELATED APPLICATIONS

This application is a continuation of International Application No. PCT/CN2015/099572, filed on Dec. 29, 2015, the disclosure of which is hereby incorporated by reference in its entirety.

TECHNICAL FIELD

The present disclosure relates to the field of information technologies, and in particular, to a deduplication method and a storage device.

BACKGROUND

With development of information technologies, a volume of data that needs to be stored increases rapidly. A deduplication technology is introduced to relieve a conflict between an infinitely increasing data volume and relatively limited storage space.

In specific implementation, the deduplication technology mainly includes the following steps:

Step 1: A storage device divides one data stream into data blocks, and specifically, using a fixed-length chunking algorithm or a variable-length chunking algorithm.

Step 2: The storage device calculates a fingerprint of each of the data blocks, where a fingerprint is also referred to as a characteristic value.

Step 3: The storage device compares the fingerprint of each of the data block with fingerprints of unique data blocks (also referred to as non-duplicate data blocks) that have been stored in the storage device; and performs step 4 when the fingerprint of a data block of the data blocks is the same as a fingerprint of a unique data block that has been stored in the storage device; performs step 5 when the fingerprint of the data block of the data blocks is different from the fingerprints of the unique data blocks that have been stored in the storage device.

Step 4: The storage device does not store the data block any longer, and increases a reference count of the unique data block that has been stored in the storage device and that has the same fingerprint as that of the data block by 1.

Step 5: The storage device sequentially stores, in the order of logical addresses (LA) of the data block, the data block in physical address (PA) of a data container of the storage device as an unique data block, sequentially stores, in the sequence of the logical address of the data block, metadata of the fingerprint of the data block in physical addresses of a fingerprint container of the storage device, generates address identifier of the metadata of the fingerprint, establishes mapping between the address identifier of the metadata of the fingerprint and the metadata of the fingerprint, and performs step 6. Metadata of the fingerprint of the data block includes the fingerprint of the data block and a physical address in which the data block is stored. An address identifier of metadata of the fingerprint may be a physical address in which the metadata of the fingerprint is stored. In another implementation manner, an address identifier of metadata of a fingerprint may be a logical identifier that uniquely identifies the metadata of the fingerprint. Specifically, the storage device may allocate a globally unique identifier to metadata of a fingerprint corresponding to a unique data block, and address identifiers of metadata of fingerprints of multiple unique data blocks whose logical addresses are contiguous increase linearly. The mapping between the address identifier of the metadata of the fingerprint and the metadata of the fingerprint is established, so that the metadata of the fingerprint can be loaded for a fingerprint query in a subsequent deduplication operation.

Step 6: The storage device establishes mappings between the logical addresses of the data blocks and the fingerprints and establishes mappings between the fingerprints and physical addresses in which the unique data blocks are stored. For a storage device having a deduplication function, it needs to be ensured that a unique data block stored in the storage device can be accessed by using a logical address, and it also needs to be ensured that a fingerprint corresponding to the unique data block is deleted after the stored unique data block is deleted. Therefore, in the storage device having the deduplication function, each of a logical address of a data block, a fingerprint of the data block, and a physical address that is of the unique data block and that is corresponding to the fingerprint is indispensable in a mapping.

However, although continual deduplication performed on stored data by the storage device saves physical space of the storage device, a large quantity of mapping relationships established by the storage device in step 6 occupy large memory space of the storage device.

SUMMARY

According to a first aspect, an embodiment of the present invention provides a deduplication method, including:

receiving, by a storage device, a first data stream;

dividing, by the storage device, the first data stream to obtain n data blocks, where logical addresses of the n data blocks are contiguous, the n data blocks include a first data block, a logical address of the first data block is a head address in the logical addresses of the n data blocks, and n is an integer not less than 2;

calculating, by the storage device, the n data blocks to obtain fingerprints of the n data blocks;

contiguously storing, by the storage device, the n data blocks in a first storage area in a sequence of the logical addresses of the n data blocks when the fingerprints of the n data blocks are not found in fingerprints in the storage device, where a physical address of the first data block stored in the first storage area is a first physical address;

contiguously storing, by the storage device, metadata of the fingerprints of the n data blocks in a second storage area in the sequence of the logical addresses of the n data blocks, where metadata of each fingerprint in the fingerprints of the n data blocks includes a respective fingerprint in the fingerprints of the n data blocks and a physical address of the respective fingerprint, the physical address being stored in the second storage area;

establishing, by the storage device, a mapping between an address identifier of the metadata of each fingerprint in the fingerprints of the n data blocks and the metadata of the respective fingerprint in the fingerprints of the n data blocks; and establishing, by the storage device, a mapping between the logical address of the first data block and an aggregation address, where the aggregation address includes a physical address of an aggregation data block and an address identifier of metadata of an aggregation fingerprint, the physical address of the aggregation data block includes the first physical address and physical address lengths of the n data blocks stored in the first storage area, and the address identifier of the metadata of the aggregation fingerprint includes an address identifier of metadata of a fingerprint of the first data block and a quantity of address identifiers of metadata of the fingerprints of the n data blocks. In the embodiments of the present invention, a quantity of mapping entries in the storage device are reduced, so that memory space of the storage device is saved, and in addition, whether metadata of a fingerprint needs to be deleted can be determined according to a mapping relationship. In some embodiments, the first storage area and the second storage area are containers. Further, the first storage area and the second storage area may be a same storage area.

With reference to the first aspect, in a first possible implementation manner, the establishing, by the storage device, a mapping between the logical address of the first data block and an aggregation address specifically includes:

establishing, by the storage device, a mapping between the logical address of the first data block and both the physical address of the aggregation data block and the address identifier of the metadata of the aggregation fingerprint.

With reference to the first aspect, in a second possible implementation manner, the establishing, by the storage device, a mapping between the logical address of the first data block and an aggregation address specifically includes:

establishing, by the storage device, a mapping between the logical address of the first data block and the address identifier of the metadata of the aggregation fingerprint and a mapping between the address identifier of the metadata of the aggregation fingerprint and the physical address of the aggregation data block.

With reference to the first aspect, in a third possible implementation manner, the establishing, by the storage device, a mapping between the logical address of the first data block and an aggregation address specifically includes:

establishing, by the storage device, a mapping between the logical address of the first data block and the physical address of the aggregation data block and a mapping between the physical address of the aggregation data block and the address identifier of the metadata of the aggregation fingerprint.

With reference to any one of the first aspect, or the first to the third possible implementation manners of the first aspect, in a fourth possible implementation manner, the method further includes:

before the establishing, by the storage device, a mapping between the logical address of the first data block and an aggregation address, determining, by the storage device, that the lengths of the physical address of the n data blocks stored in the first storage area do not exceed a compression window of the storage device.

With reference to the fourth possible implementation manner of the first aspect, in a fifth possible implementation manner, the method further includes: compressing, by the storage device according to the compression window, the n data blocks stored in the first storage area.

With reference to any one of the first aspect, or the first to the third possible implementation manners of the first aspect, in a sixth possible implementation manner, the method further includes:

receiving, by the storage device, a second data stream;

dividing, by the storage device, the second data stream to obtain n data blocks, where logical addresses of the n data blocks in the second data stream are contiguous, the n data blocks in the second data stream include a second data block, and a logical address of the second data block is a head address in the logical addresses of the n data blocks in the second data stream;

calculating, by the storage device, the n data blocks in the second data stream to obtain fingerprints of then data blocks in the second data stream; and establishing, by the storage device, a mapping between the logical address of the second data block and the aggregation address when the storage device determines, by querying the metadata of the fingerprints of the n data blocks in the first data stream, that the fingerprints of the n data blocks in the second data stream are the same as those of the n data blocks in the first data stream respective, where data block sequence locations of the n data blocks in the second data stream are the same as those of the n data blocks in the first data stream, and the data block sequence location refers to a relative location of each data block in the n data blocks in either the first data stream or the second data stream.

With reference to the first aspect, in a seventh possible implementation manner, the method further includes:

establishing, by the storage device, an index of a first fingerprint in the fingerprints of the n data blocks in the first data stream, where the index of the first fingerprint includes a mapping between the first fingerprint and an address identifier of metadata of the first fingerprint. In some embodiments, a remainder that is obtained by dividing the first fingerprint in the metadata of the first fingerprint by a specific integer meets a specific value. In some embodiments, the first fingerprint in the metadata of the first fingerprint is extracted randomly or at a specific interval from the metadata of the fingerprints that is stored in the second storage area.

In various possible implementation manners of the first aspect, the logical address of the first data block is a tail address in the logical addresses of the n data blocks in the first data stream, and the logical address of the second data block is a tail address in the logical addresses of the n data blocks in the second data stream. In some embodiments, both the mapping between the logical address of the first data block and the aggregation address and the mapping between the logical address of the second data block and the aggregation address include a mapping address direction identifier.

According to a second aspect, an embodiment of the present invention provides a deduplication method, including:

receiving, by a storage device, a first data stream;

dividing, by the storage device, the first data stream to obtain n data blocks, where logical addresses of the n data blocks are contiguous, the n data blocks include a first data block, a logical address of the first data block is a head address in the logical addresses of the n data blocks, and n is an integer not less than 2;

calculating, by the storage device, the n data blocks to obtain fingerprints of the n data blocks;

contiguously storing, by the storage device, the n data blocks in a first storage area in a sequence of the logical addresses of the n data blocks when the fingerprints of the n data blocks are not found in fingerprints in the storage device, where a physical address of the first data block stored in the first storage area is a first physical address;

contiguously storing, by the storage device, metadata of the fingerprints of the n data blocks in a second storage area in the sequence of the logical addresses of the n data blocks, where metadata of each fingerprint in the fingerprints of the n data blocks includes a respective fingerprint in the fingerprints of the n data blocks and a physical address of the respective fingerprint, the physical address being stored in the second storage area;

establishing, by the storage device, a mapping between an address identifier of the metadata of each fingerprint in the fingerprints of the n data blocks and the metadata of the respective fingerprint in the fingerprints of the n data blocks;

receiving, by the storage device, a second data stream;

dividing, by the storage device, the second data stream to obtain n data blocks, where logical addresses of the n data blocks in the second data stream are contiguous, the n data blocks in the second data stream include a second data block, and a logical address of the second data block is a head address in the logical addresses of the n data blocks in the second data stream;

calculating, by the storage device, the n data blocks in the second data stream to obtain fingerprints of the n data blocks in the second data stream; and establishing, by the storage device, a mapping between the logical address of the second data block and an aggregation address when the storage device determines, by querying the metadata of the fingerprints of the n data blocks in the first data stream, that the fingerprints of the n data blocks in the second data stream are the same as those of the n data blocks in the first data stream respective, where data block sequence locations of the n data blocks in the second data stream are the same as those of the n data blocks in the first data stream, the data block sequence location refers to a relative location of each data block in the n data blocks in either the first data stream or the second data stream, the aggregation address includes a physical address of an aggregation data block and an address identifier of metadata of an aggregation fingerprint, the physical address of the aggregation data block includes the first physical address and physical address lengths of the n data blocks stored in the first storage area, and the address identifier of the metadata of the aggregation fingerprint includes an address identifier of metadata of a fingerprint of the first data block and a quantity of address identifiers of the metadata of the fingerprints of the n data blocks. In some embodiments, the first storage area and the second storage area are containers. Further, the first storage area and the second storage area may be a same storage area.

With reference to the second aspect, in a first possible implementation manner, the establishing, by the storage device, a mapping between the logical address of the second data block and the aggregation address specifically includes:

establishing, by the storage device, a mapping between the logical address of the second data block and both the physical address of the aggregation data block and the address identifier of the metadata of the aggregation fingerprint.

With reference to the second aspect, in a second possible implementation manner, the establishing, by the storage device, a mapping between the logical address of the second data block and the aggregation address specifically includes:

establishing, by the storage device, a mapping between the logical address of the second data block and the address identifier of the metadata of the aggregation fingerprint and a mapping between the address identifier of the metadata of the aggregation fingerprint and the physical address of the aggregation data block.

With reference to the second aspect, in a third possible implementation manner, the establishing, by the storage device, a mapping between the logical address of the second data block and the aggregation address specifically includes:

establishing, by the storage device, a mapping between the logical address of the second data block and the physical address of the aggregation data block and a mapping between the physical address of the aggregation data block and the address identifier of the metadata of the aggregation fingerprint.

With reference to any one of the second aspect, or the first to the third possible implementation manners of the second aspect, in a fourth possible implementation manner, the method further includes:

before the establishing, by the storage device, a mapping between the logical address of the second data block and the aggregation address, determining, by the storage device, that the lengths of the physical address of the n data blocks stored in the first storage area do not exceed a compression window of the storage device.

With reference to the fourth possible implementation manner of the second aspect, in a fifth possible implementation manner, the method further includes: compressing, by the storage device according to the compression window, the n data blocks stored in the first storage area.

With reference to the second aspect, in a sixth possible implementation manner, the method further includes:

establishing, by the storage device, an index of a first fingerprint in the fingerprints of the n data blocks in the first data stream, where the index of the first fingerprint includes a mapping between the first fingerprint and an address identifier of metadata of the first fingerprint. In some embodiments, a remainder that is obtained by dividing the first fingerprint in the metadata of the first fingerprint by a specific integer meets a specific value. In some embodiments, the first fingerprint in the metadata of the first fingerprint is extracted randomly or at a specific interval from the metadata of the fingerprints that is stored in the second storage area.

In various possible implementation manners of the second aspect, the logical address of the first data block is a tail address in the logical addresses of the n data blocks in the first data stream, and the logical address of the second data block is a tail address in the logical addresses of the n data blocks in the second data stream. In some embodiments, the mapping between the logical address of the second data block and the aggregation address includes a mapping address direction identifier.

Correspondingly, an embodiment of the present invention further provides storage devices, respectively used as storage devices in the first aspect and various possible implementation manners of the first aspect and the second aspect and various possible implementation manners of the second aspect, so as to separately execute various possible implementation solutions in the first aspect and the second aspect. The storage device includes structural units implementing the various possible implementation solutions in the first aspect and the second aspect, or the storage device includes an interface and a processor that respectively execute the various possible implementation solutions in the first aspect and the second aspect.

Correspondingly, an embodiment of the present invention further provides a non-volatile computer readable storage medium and a computer program product. When computer instructions included in the non-volatile computer readable storage medium and the computer program product are loaded into a memory of a storage device provided in embodiments of the present invention, and a central processing unit (CPU) in the storage device executes the computer instructions, the storage device separately executes various possible implementation solutions in the first and the second aspect.

BRIEF DESCRIPTION OF DRAWINGS

FIG. 2A, FIG. 2B, and FIG. 2C are a schematic diagram of storing non-duplicate data and metadata of a fingerprint according to an embodiment of the present invention;

DESCRIPTION OF EMBODIMENTS

Figure 1:
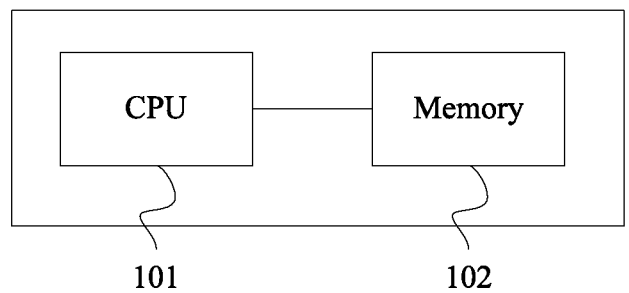
FIG. 1 is a schematic structural diagram of a storage device according to an embodiment of the present invention.

As shown in FIG. 1, a storage device having a deduplication function includes a central processing unit (CPU) 101 and a memory 102. The CPU 101 executes a computer instruction in the memory 102 to implement a deduplication operation described in embodiments of the present invention. In addition, to save computing resources of the CPU, a field programmable gate array (FPGA) or other hardware performs all operations in deduplication in the embodiments of the present invention, or an FPGA or other hardware and the CPU separately perform some of operations in deduplication in the embodiments of the present invention, so as to implement the deduplication operation described in the embodiments of the present invention. For ease of description, in the embodiments of the present invention, a processor of the storage device is configured to implement the deduplication operation in the embodiments of the present invention. The storage device further includes an interface, configured to receive a data stream, and the interface communicates with the processor. The storage device in the embodiments of the present invention further includes a persistent storage medium, configured to store a unique data block, metadata of a fingerprint, and the like that are obtained after the deduplication.

During data storage by the storage device, generally, a duplicate data block repeatedly appears in different data streams. One data stream indicates one data source, for example, one file or one application. In an actual scenario, the storage device may divide a file of 1 M into a plurality of data blocks when performing a deduplication operation. When the file is partially modified, most data of a modified file is the same as data of the file existing before the modification, and only a small amount of data is different from data of the file existing before the modification. In addition, duplicate data blocks in the files existing before and after the modification have a basically same location in a data block sequence. This attribute is referred to as data block duplicate locality in the embodiments of the present invention. Therefore, when the storage device determines that a data block in a data stream is a duplicate data block, there is a high probability that a data block adjacent to the data block is also a duplicate data block. Therefore, the storage device receives a data stream, divides the data stream into data blocks, calculates fingerprints of the data blocks, and queries whether a fingerprint that is the same as any fingerprint in the fingerprints of the data blocks is stored in the storage device. When no identical fingerprint is stored, it indicates that the data blocks are non-duplicate data blocks, and the storage device contiguously stores, in a sequence of logical addresses of the data blocks in the data stream that are not the same as a unique data block that has been stored, the data blocks in physical addresses of a specific area of the storage device. In the embodiments of the present invention, the specific area of the storage device may be a container, used to contiguously store, in physical addresses, non-duplicate data blocks in a data stream in a sequence of logical addresses. In addition, the storage device contiguously stores, in physical addresses of a specific area of the storage device, metadata of the fingerprints of the non-duplicate data blocks in the data stream in the sequence of the logical addresses of the non-duplicate data blocks. In such a fingerprint metadata storage manner, metadata of fingerprints of non-duplicate data blocks whose logical addresses are contiguous is loaded into a memory according to data block duplicate locality, so that a hit ratio of a fingerprint query in a deduplication process is increased. The storage area of the metadata of the fingerprints may be a part of the container storing the non-duplicate data blocks in the data stream, or may be an independent container. In the embodiments of the present invention, that logical addresses of data blocks are contiguous means that an end location of a logical address of one data block is a start location of a logical address of another data block. Likewise, in the embodiments of the present invention, that physical addresses are contiguous means that an end location of a physical address in which one data block is stored is a start location of a physical address in which another data block is stored. When the data blocks in the data stream that are not identical to the unique data block that has been stored in the storage device are contiguously stored in the physical addresses in the specific area of the storage device in the sequence of the logical addresses of the data blocks, the physical addresses in which the data blocks are stored are contiguous.

In the embodiments of the present invention, contiguously storing data blocks in a storage area in a sequence of logical addresses of the data blocks, sequentially storing data blocks in a storage area in a sequence of logical addresses of the data blocks, and contiguously storing data blocks in physical addresses of a storage area in a sequence of logical addresses of the data blocks have same meanings. Data blocks whose logical addresses are contiguous are also contiguous in physical addresses of the storage area.

Figure 2A:
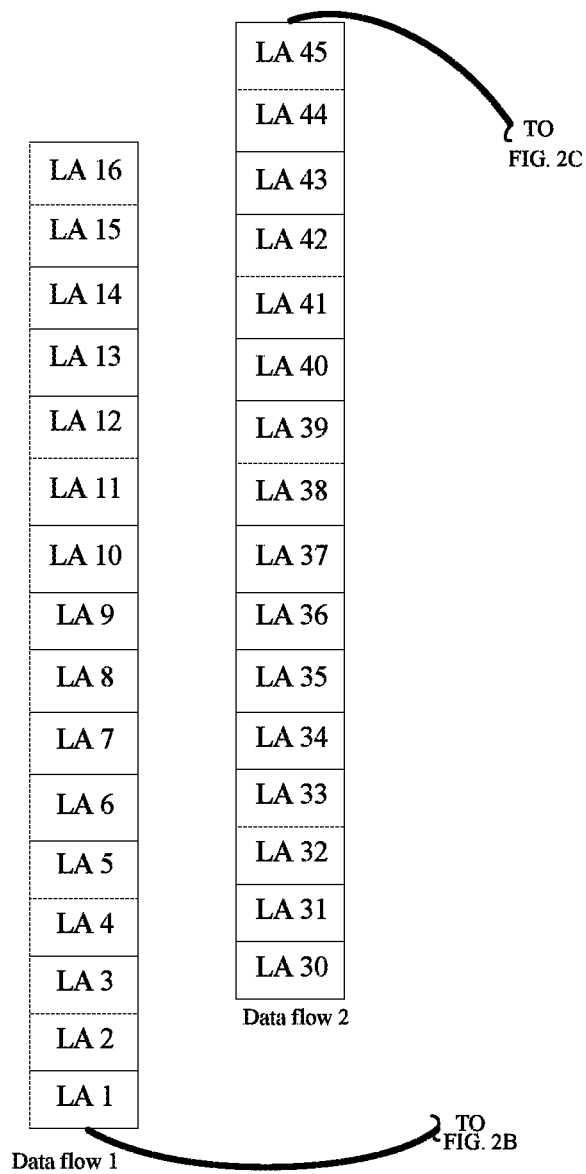
Figures 2A, 2B:

As shown in FIG. 2A, the storage device receives a data stream 1 and a data stream 2. For example, the storage device divides each of the data stream 1 and the data stream 2 into data blocks of a fixed length by using a fixed-length chunking algorithm. For ease of description, in this embodiment of the present invention, for example, all pieces of data in the data stream 1 and the data stream 2 are data written for the first time, that is, all data blocks of a fixed length that are obtained by dividing the data stream 1 and the data stream 2 are unique blocks in the storage device.

The data stream 1 includes data blocks whose logical addresses are contiguous, that is, data blocks whose logical addresses are an LA 1 to an LA 16, and fingerprints corresponding to the data blocks whose logical addresses are the LA 1 to the LA 16 are respectively an FP 1 to an FP 16. The data stream 2 includes data blocks whose logical addresses are contiguous, that is, data blocks whose logical addresses are an LA 30 to an LA 45, and fingerprints corresponding to the data blocks whose logical addresses are the LA 30 to the LA 45 are respectively an FP 30 to an FP 45.

The storage device contiguously stores data blocks in one data stream in a same container in a sequence of logical addresses. The storage device contiguously stores the data blocks in the data stream 1 in physical addresses of a container 1 in a sequence of the logical addresses: the LA 1 to the LA 16. For example, the storage device respectively stores the data blocks in the data stream 1 in physical addresses of the container 1, a PA 1 to a PA 16 (a start physical address of the container 1 is, for example, the PA 1), in the sequence of the logical addresses of the data blocks in the data stream 1, the LA 1 to the LA 16, that is, sequentially stores the data blocks whose logical addresses are the LA 1 to the LA 16 in the PA 1 to the PA 16. The storage device contiguously stores, in physical addresses of a container 3, metadata (the fingerprints of the data blocks and the physical addresses in which the data blocks are stored) of the fingerprints of the data blocks in the data stream 1 in the sequence of the logical addresses of the data blocks in the data stream 1, that is, stores the FP 1 and the PA 1 in a PA 201, stores the FP 2 and the PA 2 in a PA 202, stores the FP 3 and the PA 3 in a PA 203, stores the FP 4 and the PA 4 in a PA 204, stores the FP 5 and the PA 5 in a PA 205, stores the FP 6 and the PA 6 in a PA 206, stores the FP 7 and the PA 7 in a PA 207, stores the FP 8 and the PA 8 in a PA 208, stores the FP 9 and the PA 9 in a PA 209, stores the FP 10 and the PA 10 in a PA 210, stores the FP 11 and the PA 11 in a PA 211, stores the FP 12 and the PA 12 in a PA 212, stores the FP 13 and the PA 13 in a PA 213, stores the FP 14 and the PA 14 in a PA 214, stores the FP 15 and the PA 15 in a PA 215, and stores the FP 16 and the PA 16 in a PA 216.

The storage device establishes a mapping from address identifiers of the metadata of the fingerprints to the metadata of the fingerprints, that is, establishes a mapping from the PA 201 to the FP 1 and the PA 1, establishes a mapping from the PA 202 to the FP 2 and the PA 2, establishes a mapping from the PA 203 to the FP 3 and the PA 3, establishes a mapping from the PA 204 to the FP 4 and the PA 4, establishes a mapping from the PA 205 to the FP 5 and the PA 5, establishes a mapping from the PA 206 to the FP 6 and the PA 6, establishes a mapping from the PA 207 to the FP 7 and the PA 7, establishes a mapping from the PA 208 to the FP 8 and the PA 8, establishes a mapping from the PA 209 to the FP 9 and the PA 9, establishes a mapping from the PA 210 to the FP 10 and the PA 10, establishes a mapping from the PA 211 to the FP 11 and the PA 11, establishes a mapping from the PA 212 to the FP 12 and the PA 12, establishes a mapping from the PA 213 to the FP 13 and the PA 13, establishes a mapping from the PA 214 to the FP 14 and the PA 14, establishes a mapping from the PA 215 to the FP 15 and the PA 15, and establishes a mapping from the PA 216 to the FP 16 and the PA 16.

Because the non-duplicate data blocks whose logical addresses are the LA 1 to the LA 16 are contiguously stored in the physical addresses, that is, the non-duplicate data blocks are respectively stored in the PA 1 to the PA 16, and the metadata of the fingerprints of the non-duplicate data blocks whose logical addresses are the LA 1 to the LA 16 is also contiguously stored, that is, the metadata is respectively stored in the PA 201 to the PA 216, a mapping between the LA 1 and an aggregation address is established. The aggregation address includes a physical address of an aggregation data block and an address identifier of metadata of an aggregation fingerprint. The address identifier of the metadata of the aggregation fingerprint includes an address identifier of metadata of the fingerprint corresponding to the data block whose logical address is the LA 1 and a quantity 16 of address identifiers of the metadata of the fingerprints of the data blocks corresponding to the LA 1 to the LA 16. The physical address of the aggregation data block includes the physical address PA 1 in which the data block whose logical address is the LA 1 is stored and lengths of the physical addresses that are of the container 1 and in which the data blocks whose logical addresses are the LA 1 to the LA 16 are stored. In this embodiment of the present invention, the data blocks whose logical addresses are the LA 1 to the LA 16 are also referred to as aggregation data blocks. In some embodiments, the lengths of the physical addresses that are of the container 1 and in which the data blocks whose logical addresses are the LA 1 to the LA 16 are stored may be indicated by using actual physical lengths. In some embodiments, the lengths of the physical addresses that are of the container 1 and that are of the data blocks whose logical addresses are the LA 1 to the LA 16 may be indicated by using a quantity of physical blocks. For example, the physical address of the aggregation data block may be represented as PA 1+16, which indicates that the physical addresses in which the data blocks whose logical addresses are the LA 1 to the LA 16 are stored are the PA 1, and that a total of 16 physical blocks are stored in the physical address. The address identifier of the metadata of the aggregation fingerprint is represented as PA 201+16, which indicates that the address identifier of the metadata of the fingerprint corresponding to the data block whose logical address is the LA 1 is the PA 201, and that a total quantity of address identifiers of the metadata of the fingerprints of the data blocks corresponding to the LA 1 to the LA 16 is 16. In an implementation manner, that the storage device establishes the mapping between the LA 1 and the aggregation address specifically includes: the storage device establishes a mapping between the LA 1 and both the PA 1+16 and the PA 201+16. The mapping is represented as LA 1→PA 1+16 and PA 201+16. The PA 1+16 and the PA 201+16 are stored in a same field. Specifically, a key (key)-value (value) form may be used, that is, a key is the LA 1 and a value is the PA 1+16 and the PA 201+16. In a manner described in the prior art, 32 mappings need to be established for the data blocks in the data stream 1, that is, a mapping from the LA 1 to the FP 1, a mapping from the FP1 to the PA 1, . . . , a mapping from an LA 16 to a FP 16, and a mapping from the FP 16 to the PA 16. In this embodiment of the present invention, only one mapping needs to be established. Therefore, a quantity of mapping entries in the storage device are reduced, so that memory space of the storage device is saved, and in addition, whether metadata of a fingerprint needs to be deleted can be determined according to a mapping relationship. In some embodiments of the present invention, the storage device establishes a mapping from the LA 1 to an aggregation address 1, where the aggregation address 1 includes PA 1+8 and PA 201+8. The storage device establishes a mapping from the LA 9 to an aggregation address 2, where the aggregation address 2 includes PA 9+8 and PA 209+8. This can also reduce a quantity of mapping entries in the storage device, and in addition, whether metadata of a fingerprint needs to be deleted can be determined according to a mapping relationship. A specific physical address length of an aggregation data block may be specified according to specific implementation. This is not limited in the present invention.

In another implementation manner, that the storage device establishes the mapping between the LA 1 and the aggregation address specifically includes: the storage device establishes a mapping between the LA 1 and the address identifier of the metadata of the aggregation fingerprint, and establishes a mapping between the address identifier of the metadata of the aggregation fingerprint and the physical address of the aggregation data block. The address identifier of the metadata of the aggregation fingerprint includes the address identifier of the metadata of the fingerprint corresponding to the data block whose logical address is the LA 1 and the quantity 16 of address identifiers of the metadata of the fingerprints of the data blocks corresponding to the LA 1 to the LA 16. The physical address of the aggregation data block includes the physical address PA 1 in which the data block whose logical address is the LA 1 is stored and the lengths of the physical addresses that are of the container 1 and in which the data blocks whose logical addresses are the LA 1 to the LA 16 are stored. In a representation manner, a mapping from the LA 1 to the PA 201+16 and a mapping from the PA 201+16 to the PA 1+16 may be represented as LA 1→PA 201+16 and PA 201+16→PA 1+16, that is, a key is the LA 1 and correspondingly, a value is the PA 201+16; and a key is the PA 201+16 and correspondingly, a value is the PA 1+16. In some embodiments, the storage device establishes a mapping between the LA 1 and an address identifier 3 of the metadata of the aggregation fingerprint, and establishes a mapping between the address identifier 3 of the metadata of the aggregation fingerprint and a physical address 3 of the aggregation data block. The address identifier 3 of the metadata of the aggregation fingerprint includes PA 201+8, and the physical address 3 of the aggregation data block includes PA 1+8. The storage device establishes a mapping between the LA 9 and an address identifier 4 of the metadata of the aggregation fingerprint and a mapping between the address identifier 4 of the metadata of the aggregation fingerprint and a physical address 4 of the aggregation data block. The address identifier 4 of the metadata of the aggregation fingerprint includes PA 209+8, and the physical address 4 of the aggregation data block includes PA 9+8.

In another implementation manner, that the storage device establishes the mapping between the LA 1 and the aggregation address specifically includes: the storage device establishes a mapping between the LA 1 and the physical address of the aggregation data block, and establishes a mapping between the physical address of the aggregation data block and the address identifier of the metadata of the aggregation fingerprint. Details are not described herein. The two mappings may be represented as LA 1→PA 1+16 and PA 1+16→PA 201+16. That is, a key is the LA 1 and correspondingly, a value is the PA 1+16; and a key is the PA 1+16 and correspondingly, a value is the PA 201+16.

The storage device contiguously stores the data blocks in the data stream 2 in physical addresses of a container 2 in a sequence of the logical addresses: the LA 30 to the LA 45. For example, the data blocks in the data stream 2 are respectively stored in physical addresses of the container 2, a PA 101 to a PA 116 (a start physical address of the container 2 is, for example, the PA 101) in the sequence of the logical addresses of the data blocks in the data stream 2, the LA 30 to the LA 45.

The storage device contiguously stores, in physical addresses of a container 4, metadata of the fingerprints of the data blocks in the data stream 2 in the sequence of the logical addresses of the data blocks in the data stream 2, the LA 30 to the LA 45. That is, the storage device stores the FP 30 and the PA 101 in a PA 301, stores the FP 31 and the PA 102 in a PA 302, stores the FP 32 and the PA 103 in a PA 303, stores the FP 33 and the PA 104 in a PA 304, stores the FP 34 and the PA 105 in a PA 305, stores the FP 35 and the PA 106 in a PA 306, stores the FP 36 and the PA 107 in a PA 307, stores the FP 37 and the PA 108 in a PA 308, stores the FP 38 and the PA 109 in a PA 309, stores the FP 39 and the PA 110 in a PA 310, stores the FP 40 and the PA 111 in a PA 311, stores the FP 41 and the PA 112 in a PA 312, stores the FP 42 and the PA 113 in a PA 313, stores the FP 43 and the PA 114 in a PA 314, stores the FP 44 and the PA 115 in a PA 315, and stores the FP 45 and the PA 116 in a PA 316. The storage device establishes a mapping from address identifiers of the metadata of the fingerprints to the metadata of the fingerprints, that is, establishes a mapping from the PA 301 to the FP 30 and the PA 101, establishes a mapping from the PA 302 to the FP 31 and the PA 102, establishes a mapping from the PA 303 to the FP 32 and the PA 103, establishes a mapping from the PA 304 to the FP 33 and the PA 104, establishes a mapping from the PA 305 to the FP 34 and the PA 105, establishes a mapping from the PA 306 to the FP 35 and the PA 106, establishes a mapping from the PA 307 to the FP 36 and the PA 107, establishes a mapping from the PA 308 to the FP 37 and the PA 108, establishes a mapping from the PA 309 to the FP 38 and the PA 109, establishes a mapping from the PA 310 to the FP 39 and the PA 110, establishes a mapping from the PA 311 to the FP 40 and the PA 111, establishes a mapping from the PA 312 to the FP 41 and the PA 112, establishes a mapping from the PA 313 to the FP 42 and the PA 113, establishes a mapping from the PA 314 to the FP 43 and the PA 114, establishes a mapping from the PA 315 to the FP 44 and the PA 115, and establishes a mapping from the PA 316 to the FP 45 and the PA 116.

Because the non-duplicate data blocks whose logical addresses are the LA 30 to the LA 45 are contiguously stored in the physical addresses, that is, the non-duplicate data blocks are respectively stored in the PA 101 to the PA 116, and the metadata of the fingerprints of the non-duplicate data blocks whose logical addresses are the LA 30 to the LA 45 is also contiguously stored, that is, the metadata is respectively stored in the PA 301 to the PA 316, the storage device establishes a mapping between the LA 30 and an aggregation address. The aggregation address includes a physical address of an aggregation data block and an address identifier of metadata of an aggregation fingerprint. The address identifier of the metadata of the aggregation fingerprint includes an address identifier of metadata of the fingerprint corresponding to the data block whose logical address is the LA 30 and a quantity of address identifiers of the metadata of the fingerprints of the data blocks corresponding to the LA 30 to the LA 45. The physical address of the aggregation data block includes the physical address PA 101 in which the data block whose logical address is the LA 30 is stored and lengths of the physical addresses that are of the container 2 and in which the data blocks whose logical addresses are the LA 30 to the LA 45 are stored. In this embodiment of the present invention, the data blocks whose logical addresses are the LA 30 to the LA 45 are also referred to as aggregation data blocks. In some embodiments, the lengths of the PA 101 to the PA 116 may be indicated by using actual physical lengths. In some embodiments, the lengths of the PA 101 to the PA 116 may be indicated by using a quantity 16 of physical blocks. For example, the physical address of the aggregation data block may be represented as PA 101+16, and the address identifier of the metadata of the aggregation fingerprint is represented as PA 301+16. In an implementation manner, that the storage device establishes the mapping between the LA 30 and the aggregation address specifically includes: the storage device establishes a mapping between the LA 30 and both the PA 101+16 and the PA 301+16. The mapping is represented as LA 30→PA 101+16 and PA 301+16. For specific representation, refer to implementation described above. In a manner described in the prior art, the storage device needs to establish 32 mappings for the data blocks in the data stream 2, that is, a mapping from the LA 30 to the FP 30, a mapping from the FP 30 to the PA 301, . . . , a mapping from the LA 45 to the FP 45, and a mapping from the FP 45 to the PA 316. In this embodiment of the present invention, only one mapping needs to be established. Therefore, a quantity of mapping entries in the storage device are reduced, so that memory space of the storage device is saved, and in addition, whether metadata of a fingerprint needs to be deleted can be determined according to a mapping relationship. In some embodiments, in this embodiment of the present invention, the storage device establishes a mapping from the LA 30 to an aggregation address 5, where an aggregation address 5 includes PA 101+8 and PA 301+8. The storage device establishes a mapping from the LA 38 to an aggregation address 6, where the aggregation address 6 includes PA 109+8 and PA 309+8. This can also reduce a quantity of mapping entries in the storage device. A specific physical address length of an aggregation data block may be specified according to specific implementation. This is not limited in the present invention.

In another implementation manner, that the storage device establishes the mapping between the LA 30 and the aggregation address specifically includes: the storage device establishes a mapping between the LA 30 and the address identifier of the metadata of the aggregation fingerprint, and establishes a mapping between the address identifier of the metadata of the aggregation fingerprint and the physical address of the aggregation data block. The address identifier of the metadata of the aggregation fingerprint includes the address identifier of the metadata of the fingerprint corresponding to the data block whose logical address is the LA 30 and the quantity of address identifiers of the metadata of the fingerprints of the data blocks corresponding to the LA 30 to the LA 45. The physical address of the aggregation data block includes the physical address PA 101 in which the data block whose logical address is the LA 30 is stored and the lengths of the physical addresses that are of the container 2 and in which the data blocks whose logical addresses are the LA 30 to the LA 45 are stored. In an representation manner, a mapping from the LA 30 to the PA 301+16 and a mapping from the PA 301+16 to the PA 101+16 are represented as LA 30→PA 301+16 and PA 301+16→PA 101+16. For specific indication, refer to implementation described above. In some embodiments, the storage device establishes a mapping between the LA 30 and an address identifier 7 of the metadata of the aggregation fingerprint and a mapping between the address identifier 7 of the metadata of the aggregation fingerprint and a physical address 7 of the aggregation data block. The address identifier 7 of the metadata of the aggregation fingerprint includes PA 301+8, and the physical address 7 of the aggregation data block includes PA 30+8. The storage device establishes a mapping between the LA 38 and an address identifier 8 of the metadata of the aggregation fingerprint and a mapping between the address identifier 8 of the metadata of the aggregation fingerprint and a physical address 8 of the aggregation data block. The address identifier 8 of the metadata of the aggregation fingerprint includes PA 309+8, and the physical address 8 of the aggregation data block includes PA 38+8. This can also reduce a quantity of mapping entries in the storage device. A specific aggregation address length may be specified according to specific implementation. This is not limited in the present invention.

In another implementation manner, that the storage device establishes the mapping between the LA 30 and the aggregation address specifically includes: the storage device establishes a mapping between the LA 30 and the physical address of the aggregation data block, and establishes a mapping between the physical address of the aggregation data block and the address identifier of the metadata of the aggregation fingerprint. The two mappings are represented as LA 30→PA 101+16, and PA 101+16→PA 301+16. For specific indication, refer to implementation described above, and details are not described herein again.

Further, the storage device establishes an index of a fingerprint, to facilitate a fingerprint query in a subsequent deduplication operation, and reduce an amount of metadata of a fingerprint cached in the storage device. Specifically, a fingerprint in the metadata of the fingerprints of the data blocks in the data stream 1 and the data stream 2 may be used as a representative fingerprint (also referred to as a sample fingerprint), where a remainder that is obtained by dividing the fingerprint by a specific integer meets a specific value. For example, a remainder obtained by dividing a fingerprint by 10 is 3, and the fingerprint is used as a sample fingerprint. A mapping between the fingerprint and an address identifier of metadata of the fingerprint is established. In another implementation, a fingerprint that is in the metadata of the fingerprints and that is extracted randomly or at a specific interval from the metadata of the fingerprints that is stored in the container 3 and the container 4 may be used as a sample fingerprint. In this embodiment of the present invention, a fingerprint in the metadata of the fingerprints, which is extracted at a specific interval from the metadata of the fingerprints that is stored in the container 3 and the container 4, is used as a sample fingerprint, so as to obtain indexes of fingerprints shown in FIG. 3.

Figure 3:
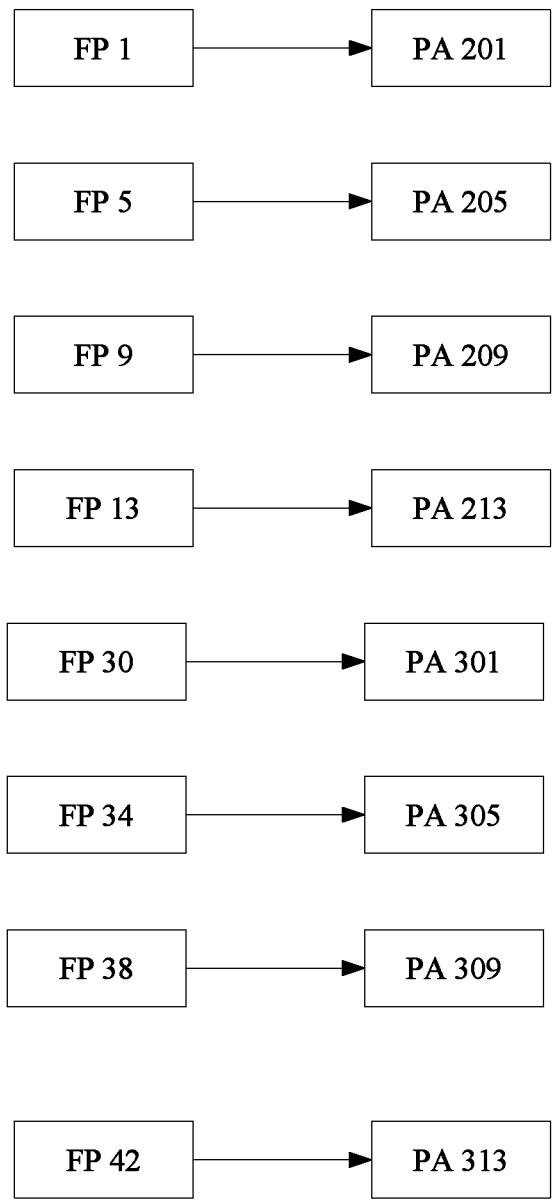
FIG. 3 is a schematic diagram of an index of a fingerprint according to an embodiment of the present invention.

The storage device loads the indexes of the fingerprints shown in FIG. 3, so as to perform the fingerprint query in the deduplication operation.

Figure 4A:
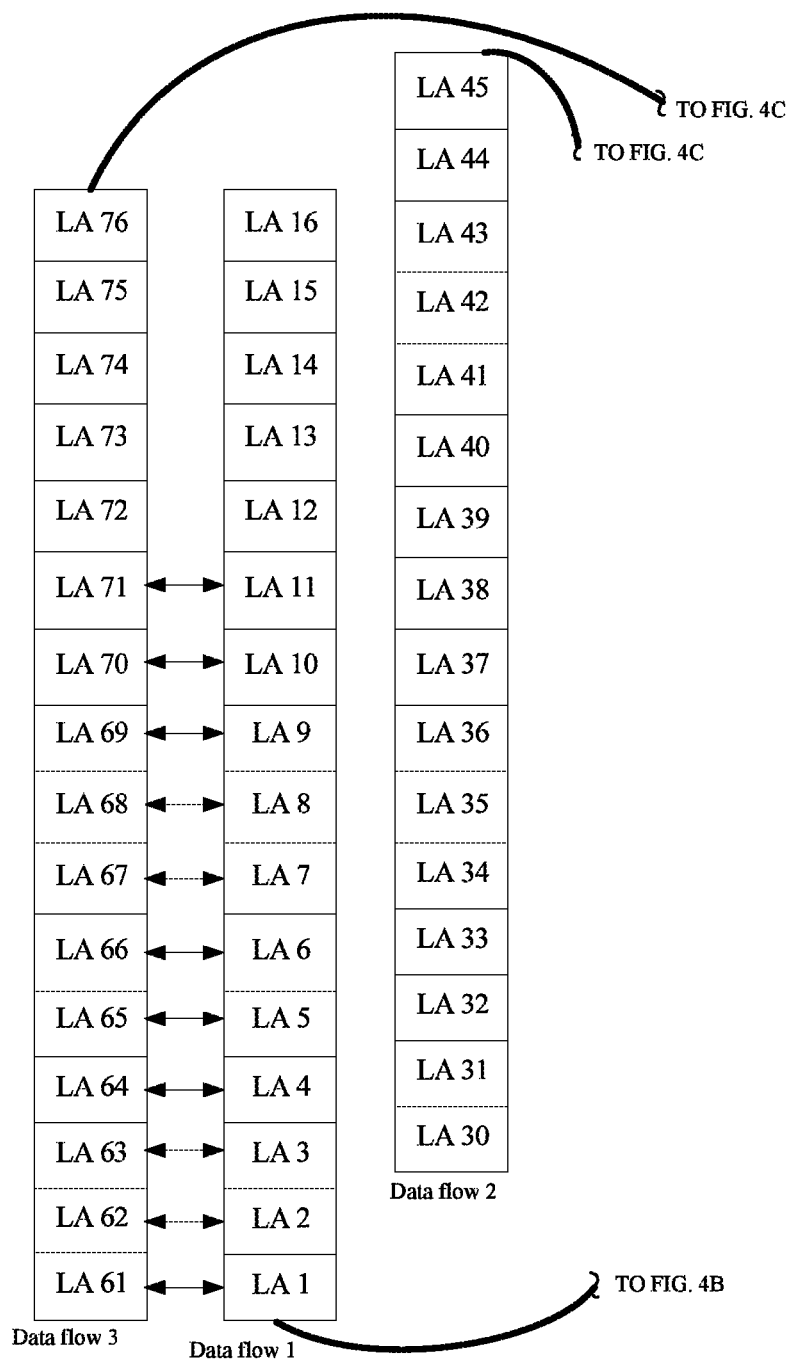
FIG. 4A, FIG. 4B, and FIG. 4C are a schematic diagram of storing non-duplicate data and metadata of a fingerprint according to an embodiment of the present invention.
Figure 4A:
Figure 4B:
Figure 4C:
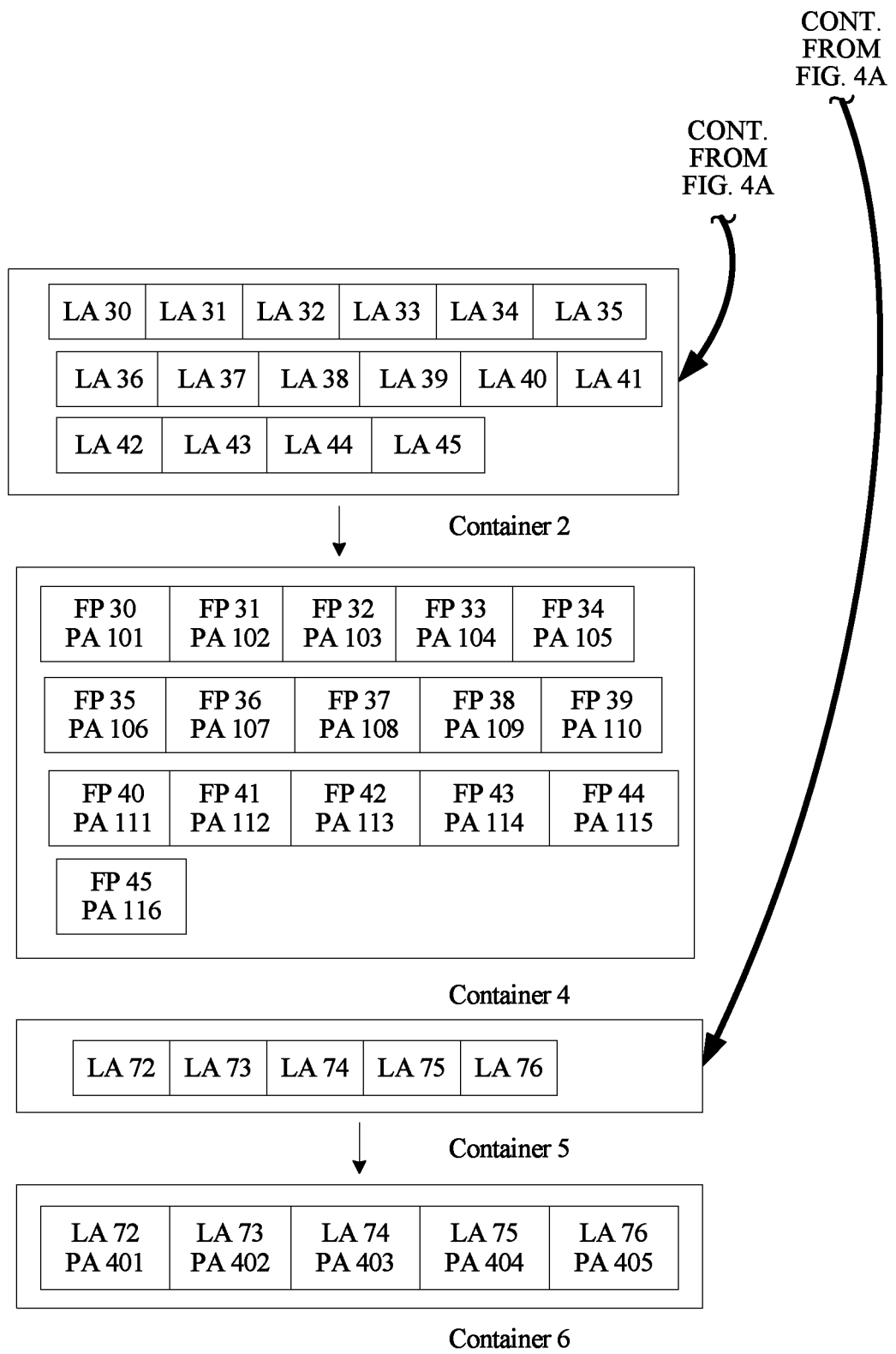

Further, as shown in FIG. 4A, the storage device receives a data stream 3, divides the data stream 3 into data blocks, and calculates fingerprints of the data blocks. A data block whose logical address is an LA 61 is the same as the data block whose logical address is the LA 1, a data block whose logical address is an LA 62 is the same as the data block whose logical address is the LA 2, a data block whose logical address is an LA 63 is the same as the data block whose logical address is the LA 3, a data block whose logical address is an LA 64 is the same as the data block whose logical address is the LA 4, a data block whose logical address is an LA 65 is the same as the data block whose logical address is the LA 5, a data block whose logical address is an LA 66 is the same as the data block whose logical address is the LA 6, a data block whose logical address is an LA 67 is the same as the data block whose logical address is the LA 7, a data block whose logical address is an LA 68 is the same as the data block whose logical address is the LA 8, a data block whose logical address is an LA 69 is the same as the data block whose logical address is the LA 9, a data block whose logical address is an LA 70 is the same as the data block whose logical address is the LA 10, and a data block whose logical address is an LA 71 is the same as the data block whose logical address is the LA 11. In the data blocks whose logical addresses are the LA 1 to the LA 11 and the data blocks whose logical addresses are the LA 61 to the LA 71, a data block sequence location of the data block whose logical address is the LA 1 is the same as that of the data block whose logical address is the LA 61, a data block sequence location of the data block whose logical address is the LA 2 is the same as that of the data block whose logical address is the LA 62, . . . , and a data block sequence location of the data block whose logical address is the LA 11 is the same as that of the data block whose logical address is the LA 71. Fingerprints of the data blocks whose logical addresses are the LA 61 to the LA 71 are sequentially the FP 1 to the FP 11.

The storage device loads the indexes of the fingerprints shown in FIG. 3, and searches the indexes of the fingerprints to find out whether there is a fingerprint that is the same as that of a data block in the data stream 3. In this embodiment of the present invention, the indexes of the fingerprints include fingerprints: the FP 1, the FP 5, the FP 9, the FP 13, the FP 30, the FP 34, the FP 38, and the FP 42. The storage device determines that fingerprints that are in the indexes of the fingerprints and that are the same as fingerprints of data blocks in the data stream 3 are the FP 1, the FP 5, the FP 9, and the FP 13. According to the data block repetition locality, at the same time when metadata, the FP 1 and the PA 1, the FP 5 and the PA 9, the FP 9 and the PA 9, and the FP 13 and the PA 13, of fingerprints corresponding to the FP 1, the FP 5, the FP 9, and the FP 13 in the indexes of the fingerprints is being loaded according to address identifiers of the metadata of the fingerprints, the FP 2 and the PA 2, the FP 3 and the PA 3, the FP 4 and the PA 4, the FP 6 and the PA 6, the FP 7 and the PA 7, the FP 8 and the PA 8, the FP 10 and the PA 10, the FP 11 and the PA 11, the FP 12 and the PA 12, the FP 14 and the PA 14, the FP 15 and the PA 15, and the FP 16 and the PA 16 are loaded.

The storage device searches the metadata of the fingerprints, and determines that the data blocks whose logical addresses are the LA 61 to the LA 71 are duplicate data blocks, and therefore, the data blocks whose logical addresses are the LA 61 to the LA 71 are not stored any more. In the storage device, physical addresses that are of the unique data blocks and that are corresponding to the data blocks whose logical addresses are the LA 61 to the LA 71 are sequentially the PA 1 to the PA 11, and a mapping between the LA 61 and an aggregation address is established. For specific implementation, refer to the foregoing description in this embodiment. In an implementation manner, that the storage device establishes the mapping between the LA 61 and the aggregation address specifically includes: the storage device establishes a mapping between the LA 61 and both PA 1+11 and PA 201+11. The mapping is represented as LA 61→PA 1+11 and PA 201+11. For a specific representation manner, refer to implementation described above. In another implementation manner, that the storage device establishes the mapping between the LA 61 and the aggregation address specifically includes: the storage device establishes a mapping between the LA 61 and an address identifier of metadata of an aggregation fingerprint, and establishes a mapping between the address identifier of the metadata of the aggregation fingerprint and a physical address of an aggregation data block. The two mappings are specifically a mapping from the LA 61 to PA 201+11 and a mapping from PA 201+11 to PA 1+11 and are represented as LA 61→PA 201+11 and PA 201+11→PA 1+11. For a specific representation manner, refer to implementation described above. In another implementation manner, that the storage device establishes the mapping between the LA 61 and the aggregation address specifically includes: the storage device establishes a mapping between the LA 61 and a physical address of an aggregation data block, and establishes a mapping between the physical address of the aggregation data block and an address identifier of metadata of an aggregation fingerprint. The two mappings are represented as LA 61→PA 1+11, and PA 1+11→PA 201+11. For a specific representation manner, refer to implementation described above, and details are not described herein again.

Data blocks whose logical addresses are an LA 72 to an LA 76 are non-duplicate data blocks. According to the implementation manners described above, to maintain the data block duplicate locality, the data blocks are stored in contiguous physical addresses, which are respectively marked as physical addresses PA 401 to PA 405, of a container 5 (a start physical address of the container 5 is the PA 401 in this embodiment of the present invention) in a sequence of the logical addresses: the LA 72 to the LA 76. Metadata of fingerprints of the data blocks whose logical addresses are the LA 72 to the LA 76 is contiguously stored in physical addresses, which are respectively marked as a PA 501 to a PA 504, of a container 6 (the first physical address of the container 6 is the PA 501 in this embodiment of the present invention) in the sequence of the logical addresses: the LA 72 to the LA 76. That is, the FP 72 and the PA 401 are stored in the PA 501, the FP 73 and the PA 402 are stored in the PA 502, the FP 74 and the PA 403 are stored in the PA 503, the FP 75 and the PA 404 are stored in the PA 504, and the FP 76 and the PA 405 are stored in the PA 505. The storage device establishes a mapping from address identifiers of the metadata of the fingerprints to the metadata of the fingerprints, that is, establishes a mapping from the PA 501 to the FP 72 and the PA 401, establishes a mapping from the PA 502 to the FP 73 and the PA 402, establishes a mapping from the PA 503 to the FP 74 and the PA 403, establishes a mapping from the PA 504 to the FP 75 and the PA 404, and establishes a mapping from the PA 505 to the FP 76 and the PA 405. Because the non-duplicate data blocks whose logical addresses are the LA 72 to the LA 76 are contiguously stored in the physical addresses, that is, the non-duplicate data blocks are sequentially stored in the PA 401 to the PA 405, and the metadata of the fingerprints of the non-duplicate data blocks whose logical addresses are the LA 72 to the LA 76 is also contiguously stored in the physical addresses of the container 6, a mapping between the LA 72 and an aggregation address is established. According to the method described above in this embodiment of the present invention, in an implementation manner, that the storage device establishes the mapping between the LA 72 and the aggregation address specifically includes: establishing a mapping between the LA 72 and PA 501+5 and PA 601+5. The mapping is represented as LA 72→PA 501+5 and PA 601+5. For a specific representation manner, refer to implementation described above. In another implementation manner, that the storage device establishes the mapping between the LA 72 and the aggregation address specifically includes: the storage device establishes a mapping between the LA 72 and an address identifier of metadata of an aggregation fingerprint, and establishes a mapping between the address identifier of the metadata of the aggregation fingerprint and a physical address of an aggregation data block. The two mappings are specifically a mapping between the LA 72 and PA 601+5 and a mapping from the PA 601+5 to PA 501+5 and are represented as LA 72→PA 601+5 and PA 601+5→PA 501+5. For a specific representation manner, refer to implementation described above. In another implementation manner, that the storage device establishes the mapping between the LA 72 and the aggregation address specifically includes: the storage device establishes a mapping between the LA 72 and a physical address of an aggregation data block, and establishes a mapping between the physical address of the aggregation data block and an address identifier of metadata of an aggregation fingerprint. The two mappings are represented as LA 72→PA 501+5, and PA

501+5→PA 601+5. For a specific representation manner, refer to implementation described above, and details are not described herein again.

Figure 5:
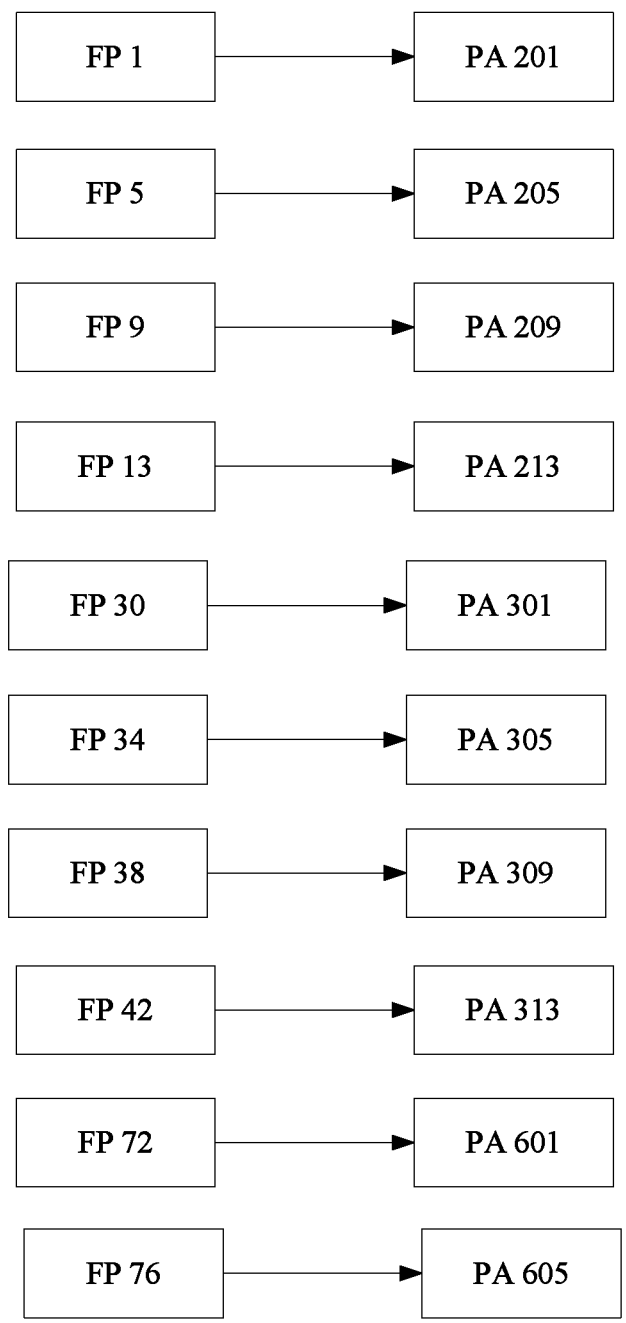
FIG. 5 is a schematic diagram of an index of a fingerprint according to an embodiment of the present invention.

The storage device performs sampling on fingerprints of non-duplicate data blocks whose logical addresses are the LA 64 to the LA 68, and establishes indexes of the fingerprints. In this embodiment of the present invention, a fingerprint that is in the metadata of the fingerprints and that is extracted at a specific interval from the metadata of the fingerprints that is stored in the container 6 is used as a sample fingerprint, so as to obtain indexes of new fingerprints shown in FIG. 5 compared with those in FIG. 3.

In this embodiment of the present invention, for example, the storage device establishes the mapping of LA 1→PA 1+16 and PA 201+16. When the storage device receives a data read request, where a logical address carried in the data read request is the LA 2, the storage device queries the mapping of LA 1→PA 1+16 and PA 201+16, and determines that there is a difference of one logical address between the LA 2 and the LA 1, and therefore, the storage device reads data from a physical address corresponding to a logical address, where there is a difference of one logical address between the logical address and the LA 1.

In actual implementation, the storage device compresses a stored unique data block by using a compression algorithm. The storage device sets a compression window for compressing the unique data block. The compression window refers to a length of data blocks that can be compressed at a time. Therefore, in this embodiment of the present invention, a physical address length of an aggregation data block does not exceed the compression window. In some embodiments, before establishing a mapping from a logical address to an aggregation address, the storage device queries the compression window of the storage device, and determines that the physical address length of the aggregation data block does not exceed the compression window. For example, in this embodiment of the present invention, for the data blocks whose logical addresses are the LA 1 to the LA 16, the mapping of LA 1→PA 1+16 and PA 201+16 may be established. However, if the physical address length of the aggregation data block exceeds the compression window, multiple mappings, for example, a mapping of LA 1→PA 1+8 and PA 201+8 and a mapping of LA 9→PA 9+8 and PA 209+8 may be established. The storage device compresses stored non-duplicate data according to the compression window.

In this embodiment of the present invention, the non-duplicate data stored in the container 5 and the metadata of the fingerprints that is stored in the container 6 may be stored in a same container such as the container 5. This is not intended to be limiting.

In this embodiment of the present invention, for example, for the data blocks whose logical addresses are the LA 1 to the LA 16, the mapping of LA 1→PA 1+16 and PA 201+16 may be established. The mapping includes a mapping address direction identifier, used to indicate that addressing is performed in ascending order of the logical addresses by starting from the LA 1. In some embodiments, the mapping address direction identifier may be represented by using the physical addresses of the aggregation data blocks and the address identifiers of the metadata of the aggregation fingerprints. For example, the physical addresses of the aggregation data blocks ascend from the PA 1 and the address identifiers of the metadata of the aggregation fingerprints ascend from the PA 201. Correspondingly, in another implementation manner, a mapping of LA 16→PA 16−16 and PA 216−16 may be established. This can also reduce a quantity of mapping entries and save memory space of the storage device. The mapping includes a mapping address direction identifier, used to indicate that addressing is performed in descending order of the logical addresses by starting from the LA 16. In some embodiments, the mapping address direction identifier may be represented by using the physical addresses of the aggregation data blocks and the address identifiers of the metadata of the aggregation fingerprints. For example, the physical addresses of the aggregation data blocks descend from the PA 16 and the address identifiers of the metadata of the aggregation fingerprints descend from the PA 216. Details are not described in this embodiment of the present invention.

In this embodiment of the present invention, a fixed-length chunking algorithm is used as an example to divide a data stream into data blocks. In another scenario, a variable-length chunking algorithm such as a content-defined chunking (CDC) algorithm may be used to divide a data stream into data blocks. The storage device in this embodiment of the present invention may implement a deduplication operation in a file system such as a network attached system (NAS), and correspondingly, the logical address in this embodiment of the present invention is a file identifier plus an offset address. The storage device in this embodiment of the present invention may also implement a deduplication operation on data blocks in a network, for example, a storage area network (SAN), and correspondingly, the logical address in this embodiment of the present invention is a logical block address (LBA).

In this embodiment of the present invention, an address identifier of metadata of a fingerprint may be a logical identifier that uniquely identifies the metadata of the fingerprint. The storage device may allocate a globally unique identifier to metadata of a fingerprint corresponding to a unique data block. Address identifiers of metadata of fingerprints of multiple unique data blocks whose logical addresses are contiguous increase linearly. For example, the address identifiers of the metadata of the fingerprints of the data blocks whose logical addresses are the LA 1 to the LA 16 may be sequentially a chunk identifier (Chunk ID) 1 to a chunk ID 16. In specific implementation, the storage device performs a deduplication operation on a data stream, and determines unique data blocks that are in the data stream and whose logical addresses are contiguous. The storage device sequentially stores, in physical addresses of a container in a sequence of the logical addresses of the unique data blocks, metadata of fingerprints of the unique data blocks that are in the data stream and whose logical addresses are contiguous. The storage device generates, in the sequence of the logical addresses of the unique data blocks, globally unique chunk IDs for the metadata of the fingerprints of these unique data blocks. These chunk IDs ascend linearly in the sequence of the logical addresses of these unique data blocks.

In this embodiment of the present invention, unique data blocks in a same data stream and metadata of fingerprints of the unique data blocks are separately stored in different containers. In other implementation, unique data blocks in a same data stream and metadata of fingerprints of the unique data blocks may be stored in different storage areas of a same container.

In this embodiment of the present invention, a container is used to store a unique data block and metadata of a fingerprint. In another implementation, a tree structure may be used to store a unique data block and metadata of a fingerprint. In specific implementation, a leaf node of a tree may be used to store a unique data block and metadata of a fingerprint.

In some embodiments, in this embodiment of the present invention, a mapping from a logical address to an aggregation address in this embodiment of the present invention may be established only for duplicate data blocks whose logical addresses are contiguous. For non-duplicate data blocks whose logical addresses are contiguous, a one-to-one mapping is established according to existing implementation.

Figure 6:
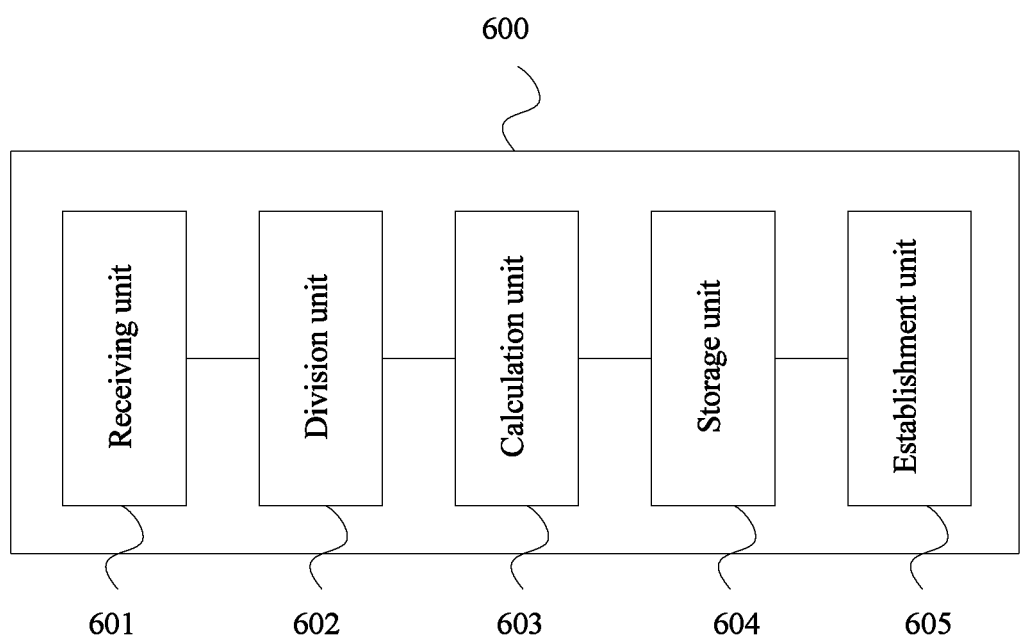
FIG. 6 is a schematic structural diagram of a storage device according to an embodiment of the present invention.

As shown in FIG. 6, an embodiment of the present invention provides a storage device 600, including a receiving unit 601, a division unit 602, a calculation unit 603, a storage unit 604, and an establishment unit 605. The receiving unit 601 is configured to receive a first data stream. The division unit 602 is configured to divide the first data stream to obtain n data blocks, where logical addresses of the n data blocks are contiguous, the n data blocks include a first data block, a logical address of the first data block is a head address in the logical addresses of the n data blocks, and n is an integer not less than 2. The calculation unit 603 is configured to calculate the n data blocks to obtain fingerprints of the n data blocks. The storage unit 604 is configured to: contiguously store the n data blocks in a first storage area in a sequence of the logical addresses of the n data blocks when the fingerprints of the n data blocks are not found in fingerprints in the storage device 600, and contiguously store metadata of the fingerprints of the n data blocks in a second storage area in the sequence of the logical addresses of the n data blocks, where a physical address of the first data block stored in the first storage area is a first physical address, and metadata of each fingerprint in the fingerprints of the n data blocks includes a respective fingerprint in the fingerprints of the n data blocks and a physical address of the respective fingerprint, the physical address being stored in the second storage area. The establishment unit 605 is configured to: establish a mapping between an address identifier of the metadata of each fingerprint in the fingerprints of the n data blocks and the metadata of the respective fingerprint in the fingerprints of the n data blocks, and establish a mapping between the logical address of the first data block and an aggregation address, where the aggregation address includes a physical address of an aggregation data block and an address identifier of metadata of an aggregation fingerprint, the physical address of the aggregation data block includes the first physical address and physical address lengths of the n data blocks stored in the first storage area, and the address identifier of the metadata of the aggregation fingerprint includes an address identifier of metadata of a fingerprint of the first data block and a quantity of address identifiers of metadata of the fingerprints of then data blocks.

In this embodiment of the present invention, a quantity of mapping entries in the storage device are reduced, so that memory space of the storage device is saved, and in addition, whether metadata of a fingerprint needs to be deleted can be determined according to a mapping relationship.

In some embodiments, the first storage area and the second storage area in the storage device 600 are containers. Further, the first storage area and the second storage area may be a same storage area.

In some embodiments, the establishment unit 605 is specifically configured to establish a mapping between the logical address of the first data block and both the physical address of the aggregation data block and the address identifier of the metadata of the aggregation fingerprint.

In some embodiments, the establishment unit 605 is specifically configured to establish a mapping between the logical address of the first data block and the address identifier of the metadata of the aggregation fingerprint and a mapping between the address identifier of the metadata of the aggregation fingerprint and the physical address of the aggregation data block.

In some embodiments, the establishment unit 605 is specifically configured to establish a mapping between the logical address of the first data block and the physical address of the aggregation data block and a mapping between the physical address of the aggregation data block and the address identifier of the metadata of the aggregation fingerprint.

In some embodiments, the storage device 600 further includes a determining unit, where the determining unit is configured to determine, before the mapping between the logical address of the first data block and the aggregation address is established, that the lengths of the physical address of the n data blocks stored in the first storage area do not exceed a compression window of the storage device.

In some embodiments, the storage device 600 further includes a compression unit, where the compression unit is configured to compress, according to the compression window, the n data blocks stored in the first storage area.

In some embodiments, the receiving unit 601 is further configured to receive a second data stream. The division unit 602 is further configured to divide the second data stream to obtain n data blocks, where logical addresses of the n data blocks in the second data stream are contiguous, the n data blocks in the second data stream include a second data block, and a logical address of the second data block is a head address in the logical addresses of the n data blocks in the second data stream. The calculation unit 603 is further configured to calculate the n data blocks in the second data stream to obtain fingerprints of the n data blocks in the second data stream. The establishment unit 605 is further configured to establish a mapping between the logical address of the second data block and the aggregation address when the storage device 600 determines, by querying the metadata of the fingerprints of the n data blocks in the first data stream, that the fingerprints of the n data blocks in the second data stream are the same as those of the n data blocks in the first data stream respective, where data block sequence locations of the n data blocks in the second data stream are the same as those of the n data blocks in the first data stream, and the data block sequence location refers to a relative location of each data block in the n data blocks in either the first data stream or the second data stream.

In some embodiments, the establishment unit 605 is further configured to establish an index of a first fingerprint in the fingerprints of the n data blocks in the first data stream, where the index of the first fingerprint includes a mapping between the first fingerprint and an address identifier of metadata of the first fingerprint.

For a specific function and specific implementation of the storage device 600 provided in this embodiment of the present invention, refer to the method and steps described in the foregoing embodiment, and details are not described herein again.

For the storage device 600 shown in FIG. 6, in an implementation manner, the foregoing units are installed on the storage device 600, the foregoing units may be loaded into a memory of the storage device 600, and a CPU in the storage device 600 executes an instruction in the memory to implement functions in corresponding embodiments of the present invention. In another implementation, a unit included in the storage device 600 may be implemented by using hardware or in a manner in which hardware and a CPU execute an instruction in a memory. The foregoing units are also referred to as structural units.

The embodiments of the present invention further provide a non-volatile computer readable storage medium and a computer program product. When computer instructions included in the non-volatile computer readable storage medium and the computer program product are loaded into a memory of a CPU in the storage device 600 shown in FIG. 6, the CPU executes the computer instructions loaded into the memory, so as to implement corresponding functions in all the embodiments of the present invention.

In the embodiments provided in the present invention, it should be understood that the disclosed apparatus and method may be implemented in other manners. For example, the unit division in the described apparatus embodiment is merely logical function division and may be another division in actual implementation. For example, a plurality of units or components may be combined or be integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units may be integrated into one unit.

What is claimed is:

1. A deduplication method, comprising:
   receiving, by a storage device, a first data stream;
   dividing, by the storage device, the first data stream to obtain n data blocks, wherein logical addresses of the n data blocks are contiguous, the n data blocks comprise a first data block, a logical address of the first data block is a head address in the logical addresses of the n data blocks, and n is an integer not less than 2;
   obtain, by the storage device, fingerprints of the n data blocks;
   contiguously storing, by the storage device, the n data blocks in a first storage area in a sequence of the logical addresses of the n data blocks when the fingerprints of the n data blocks are not found in the storage device, wherein a physical address of the first data block is a first physical address, and the first data block being stored in the first storage area;
   contiguously storing, by the storage device, metadata of the fingerprints of the n data blocks in a second storage area in the sequence of the logical addresses of the n data blocks, wherein metadata of a given fingerprint in the fingerprints of the n data blocks comprises a the given fingerprint and a physical address of the given fingerprint, the given fingerprint being stored in the second storage area;
   establishing, by the storage device, a mapping between an address identifier of the metadata of the given fingerprint in the fingerprints of the n data blocks and the metadata of the given fingerprint; and
   establishing, by the storage device, a mapping between the logical address of the first data block and an aggregation address, wherein
   the aggregation address comprises a physical address of an aggregation data block and an address identifier of metadata of an aggregation fingerprint,
   the physical address of the aggregation data block comprises the first physical address and physical address lengths of the n data blocks stored in the first storage area, and
   the address identifier of the metadata of the aggregation fingerprint comprises an address identifier of metadata of a fingerprint of the first data block and a quantity of address identifiers of metadata of the fingerprints of the n data blocks.

2. The method according to claim 1, wherein the method further comprises:
   establishing, by the storage device, a mapping between the logical address of the first data block and both the physical address of the aggregation data block and the address identifier of the metadata of the aggregation fingerprint.

3. The method according to claim 1, wherein the method further comprises:
   establishing, by the storage device, a mapping between the logical address of the first data block and the address identifier of the metadata of the aggregation fingerprint and a mapping between the address identifier of the metadata of the aggregation fingerprint and the physical address of the aggregation data block.

4. The method according to claim 1, wherein the method further comprises:
   establishing, by the storage device, a mapping between the logical address of the first data block and the physical address of the aggregation data block and a mapping between the physical address of the aggregation data block and the address identifier of the metadata of the aggregation fingerprint.

5. The method according to claim 1, wherein the method further comprises:
   determining, by the storage device, that the lengths of the physical address of the n data blocks stored in the first storage area do not exceed a compression window of the storage device.

6. The method according to claim 5, wherein the method further comprises: compressing, by the storage device according to the compression window, the n data blocks stored in the first storage area.

7. The method according to claim 1, further comprising:
   receiving, by the storage device, a second data stream;
   dividing, by the storage device, the second data stream to obtain n data blocks, wherein logical addresses of the n data blocks in the second data stream are contiguous, the n data blocks in the second data stream comprise a second data block, and a logical address of the second data block is a head address in the logical addresses of the n data blocks in the second data stream;
   calculating, by the storage device, the n data blocks in the second data stream to obtain fingerprints of the n data blocks in the second data stream; and
   establishing, by the storage device, a mapping between the logical address of the second data block and the aggregation address when the fingerprints of the n data blocks in the second data stream are the same as those of the n data blocks in the first data stream respective, wherein data block sequence locations of the n data blocks in the second data stream are the same as those of the n data blocks in the first data stream, and the data block sequence location refers to a relative location of each data block in the n data blocks in either the first data stream or the second data stream.

8. The method according to claim 1, wherein the method further comprises:
establishing, by the storage device, an index of a first fingerprint in the fingerprints of the n data blocks in the first data stream, wherein the index of the first fingerprint comprises a mapping between the first fingerprint and an address identifier of metadata of the first fingerprint.

9. A storage device, comprising an interface and a processor, wherein the interface communicates with the processor;
the interface is configured to receive a first data stream; and
the processor is configured to:
divide the first data stream to obtain n data blocks, wherein logical addresses of the n data blocks are contiguous, the n data blocks comprise a first data block, a logical address of the first data block is a head address in the logical addresses of the n data blocks, and n is an integer not less than 2;
obtain fingerprints of the n data blocks;
contiguously store the n data blocks in a first storage area in a sequence of the logical addresses of the n data blocks when the fingerprints of the n data blocks are not found in fingerprints in the storage device, wherein a physical address of the first data block is a first physical address, and the first data block being stored in the first storage area;
contiguously store metadata of the fingerprints of the n data blocks in a second storage area in the sequence of the logical addresses of the n data blocks, wherein metadata of a given fingerprint in the fingerprints of the n data blocks comprises a the given fingerprint and a physical address of the given fingerprint, the given fingerprint being stored in the second storage area;
establish a mapping between an address identifier of the metadata of the given fingerprint in the fingerprints of the n data blocks and the metadata of the given fingerprint in the fingerprints of the n data blocks; and
establish a mapping between the logical address of the first data block and an aggregation address, wherein
the aggregation address comprises a physical address of an aggregation data block and an address identifier of metadata of an aggregation fingerprint,
the physical address of the aggregation data block comprises the first physical address and physical address lengths of the n data blocks stored in the first storage area, and
the address identifier of the metadata of the aggregation fingerprint comprises an address identifier of metadata of a fingerprint of the first data block and a quantity of address identifiers of metadata of the fingerprints of the n data blocks.

10. The storage device according to claim 9, wherein the processor is further configured to establish a mapping between the logical address of the first data block and both the physical address of the aggregation data block and the address identifier of the metadata of the aggregation fingerprint.

11. The storage device according to claim 9, wherein the processor is further configured to establish a mapping between the logical address of the first data block and the address identifier of the metadata of the aggregation fingerprint and a mapping between the address identifier of the metadata of the aggregation fingerprint and the physical address of the aggregation data block.

12. The storage device according to claim 9, wherein the processor is further configured to establish a mapping between the logical address of the first data block and the physical address of the aggregation data block and a mapping between the physical address of the aggregation data block and the address identifier of the metadata of the aggregation fingerprint.

13. The storage device according to claim 9, wherein the processor is further configured to determine that the lengths of the physical address of the n data blocks stored in the first storage area do not exceed a compression window of the storage device.

14. The storage device according to claim 13, wherein the processor is further configured to compress, according to the compression window, the n data blocks stored in the first storage area.

15. The storage device according to claim 9, wherein
the interface is further configured to receive a second data stream; and
the processor is further configured to:
divide the second data stream to obtain n data blocks, wherein logical addresses of the n data blocks in the second data stream are contiguous, the n data blocks in the second data stream comprise a second data block, and a logical address of the second data block is a head address in the logical addresses of the n data blocks in the second data stream;
calculate the n data blocks in the second data stream to obtain fingerprints of the n data blocks in the second data stream; and
establish a mapping between the logical address of the second data block and the aggregation address when the fingerprints of the n data blocks in the second data stream are the same as those of the n data blocks in the first data stream respective, wherein data block sequence locations of the n data blocks in the second data stream are the same as those of the n data blocks in the first data stream, and the data block sequence location refers to a relative location of each data block in the n data blocks in either the first data stream or the second data stream.

16. The storage device according to claim 9, wherein the processor is further configured to establish an index of a first fingerprint in the fingerprints of the n data blocks in the first data stream, wherein the index of the first fingerprint comprises a mapping between the first fingerprint and an address identifier of metadata of the first fingerprint.

* * * * *